United States Patent
Hayamura et al.

(10) Patent No.: US 7,459,718 B2
(45) Date of Patent: Dec. 2, 2008

(54) FIELD EFFECT TRANSISTOR

(75) Inventors: Mitsuo Hayamura, Naruto (JP); Shiro Akamatsu, Anan (JP)

(73) Assignee: Nichia Corporation, Anan-Shi Tokushima (JP)

(*) Notice: Subject to any disclaimer, the term of this patent is extended or adjusted under 35 U.S.C. 154(b) by 346 days.

(21) Appl. No.: 11/385,690

(22) Filed: Mar. 22, 2006

(65) Prior Publication Data
US 2006/0214193 A1 Sep. 28, 2006

(30) Foreign Application Priority Data
Mar. 23, 2005 (JP) ............... 2005-084463

(51) Int. Cl.
*H01L 29/812* (2006.01)
*H01L 29/778* (2006.01)

(52) U.S. Cl. ............ 257/12; 257/11; 257/103; 257/192; 257/E21.125; 257/E21.129; 438/166; 438/172; 438/191; 438/932

(58) Field of Classification Search ............ 257/11, 257/12, 103, 192; 438/172, 191, 932
See application file for complete search history.

(56) References Cited

U.S. PATENT DOCUMENTS

| | | | |
|---|---|---|---|
| 5,290,393 | A | 3/1994 | Nakamura |
| 6,548,333 | B2 | 4/2003 | Smith |
| 6,777,278 | B2 | 8/2004 | Smith |
| 2001/0015437 | A1 | 8/2001 | Ishii et al. |
| 2002/0066908 | A1 | 6/2002 | Smith |
| 2002/0096692 | A1 | 7/2002 | Nakamura et al. |
| 2003/0001162 | A1* | 1/2003 | Udagawa .............. 257/79 |
| 2003/0157776 | A1 | 8/2003 | Smith |
| 2004/0137657 | A1* | 7/2004 | Dmitriev et al. ........... 438/47 |

FOREIGN PATENT DOCUMENTS

| | | |
|---|---|---|
| EP | 0497350 A1 | 8/1992 |
| JP | 11-163334 A2 | 6/1999 |
| JP | 11-297713 A2 | 10/1999 |
| JP | 2000-277803 | 10/2000 |
| JP | 2001-247399 | 9/2001 |
| JP | 2003-282598 | 10/2003 |
| JP | 2004-047764 | 2/2004 |
| JP | 2004-319552 A2 | 11/2004 |
| JP | 2004-342810 A2 | 12/2004 |
| JP | 2005-005657 A2 | 1/2005 |
| WO | WO-03/007383 A2 | 1/2003 |

* cited by examiner

OTHER PUBLICATIONS

Rajan S. et al.; "MBE-Grown AlGaN/GaN HEMT's on SiC", High Performance Devices, 2004, Proceedings, IEEE Lester Eastman Conference on Rensselaer Polytechnic Inst., Troy, NY, USA Aug. 4-6, 2004, Piscataway, NJ, USA, IEEE, Aug. 4, 2004, pp. 108-113, Xp010857764 ISBN: 981-256-196-X.

*Primary Examiner*—Dao H Nguyen
(74) *Attorney, Agent, or Firm*—Birch, Stewart, Kolasch & Birch, LLP

(57) ABSTRACT

A FET includes a nitride semiconductor in which leak current is reduced and breakdown voltage is improved. The FET is formed from a substrate, a buffer layer made of a nitride semiconductor, a first semiconductor layer made of a nitride semiconductor, and a second semiconductor layer made of a nitride semiconductor, wherein at least the buffer layer and the first semiconductor layer include a p-type dopant. The concentration of the p-type dopant is higher in the buffer layer than that in the first semiconductor layer, and the concentration of the p-type dopant is higher in the first semiconductor layer than that in the second semiconductor layer.

14 Claims, 3 Drawing Sheets

FIELD EFFECT TRANSISTOR

FIELD-EFFECT TRANSISTOR

This application claims priority under 37 C.F.R. §119 of Japanese application no. 2005-84463, filed Mar. 23, 2005, the entire contents of which are hereby incorporated by reference.

BACKGROUND OF THE INVENTION

1. Field of the Invention

A field-effect transistor employs a nitride semiconductor, and specifically a field-effect transistor includes an active region such as a channel formed by stacking the semiconductor layers over a substrate via an underlayer such as a buffer layer.

2. Description of the Related Art

A field-effect transistor (FET) having a stacked layer of nitride semiconductors has been predicted to be a high output power semiconductor device that can operate at high frequencies with high breakdown voltage. Some of these field-effect transistors, for example, a Metal Semiconductor FET (MESFET) and a HEMT High Electron Mobility Transistor (HEMT) are described in, for example, Japanese Unexamined Patent Application Publication Nos. H-11-297713 and 2001-247399, and International Publication No. WO 03/007383.

An example of an HEMT formed from a nitride semiconductor is shown in FIG. 3. The HEMT shown in FIG. 3 includes a carrier transit layer (channel layer) 303 made of GaN and a carrier (electron) supply layer 305 made of AlGaN that are stacked over a sapphire substrate 301 via a buffer layer 302. A source electrode 311, a gate electrode 312, and a drain electrode 313 are respectively disposed over a top surface of the carrier supply layer 305. When a voltage is applied to the drain electrode 313, electrons are supplied from the source electrode 311 to the carrier supply layer 305, and from the carrier supply layer 305 to the carrier transit layer 303. The supplied electrons form a two-dimensional electron gas (2DEG), which performs as a channel in the carrier transit layer 305 in a region along the carrier supply layer 305. With high mobility, the electrons again flow in the channel formed in the carrier transit layer 303 and through the carrier supply layer 305, and the electrons further flow into the drain electrode 313. Since the range of the channel changes according to the voltage applied to the gate electrode 312, the amount of electric current that flows between the source electrode 311 and the drain electrode 313 can be controlled by adjusting the voltage applied to the gate electrode 312.

However, in a conventional FET formed from a nitride semiconductor, a certain amount of leakage current generates, resulting in poor breakdown voltage. That is, the electric current flows in a region other than the channel such as an underlayer, which should be insulated. As a result, the electric current flowing between the source electrode and the drain electrode cannot be sufficiently controlled even the voltage applied on the gate electrode is adjusted.

SUMMARY OF THE INVENTION

The invention has been devised to solve the above problems, and therefore, is aimed at providing a FET comprising a nitride semiconductor, in which leak current is reduced and breakdown voltage is improved.

The invention, in part, pertains to a field-effect transistor that includes a substrate, a buffer layer made of a nitride semiconductor, a first semiconductor layer made of a nitride semiconductor, and a second semiconductor layer made of a nitride semiconductor. At least the buffer layer and the first semiconductor layer include a p-type impurity (i.e. dopant). The concentration of the p-type dopant in the buffer layer is higher than the concentration of the p-type dopant in the first semiconductor layer, and the concentration of the p-type dopant in the first semiconductor layer is higher than the concentration of the p-type dopant in the second semiconductor layer.

In the invention, the concentration of the p-type dopant in the first semiconductor layer preferably decreases along a direction of a thickness from the interface with the buffer layer or in the vicinity of the interface toward the second semiconductor layer.

Also, the concentration of the p-type dopant in the buffer layer is preferably in a range between about $1\times10^{16}/cm^3$ and about $5\times10^{21}/cm^3$.

Further, the concentration of the p-type dopant in the first semiconductor layer is preferably in a range between about $5\times10^{16}/cm^3$ and about $1\times10^{19}/cm^3$.

Additionally, the concentration of the p-type dopant in the second semiconductor layer is preferably less than about $5\times10^{17}/cm^3$.

In the invention, it is preferable to have the substrate, the first semiconductor layer, the second semiconductor layer, and a third semiconductor layer formed from a nitride semiconductor layer, where the second semiconductor layer is a carrier transit layer and the third semiconductor layer is a carrier supply layer.

It is to be understood that both the foregoing general description and the following detailed description are exemplary and explanatory and are intended to provide further explanation of the invention as claimed.

BRIEF DESCRIPTION OF THE DRAWINGS

The accompanying drawings are included to provide a further understanding of the invention. The drawings illustrate embodiments of the invention and together with the description serve to explain the principles of the embodiments of the invention.

DETAILED DESCRIPTION OF THE PREFERRED EMBODIMENTS

Advantages of the invention will become more apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

The invention provides a field-effect transistor in which the leak current in the current traveling layer is reduced and the breakdown voltage property is improved.

Figure 1:
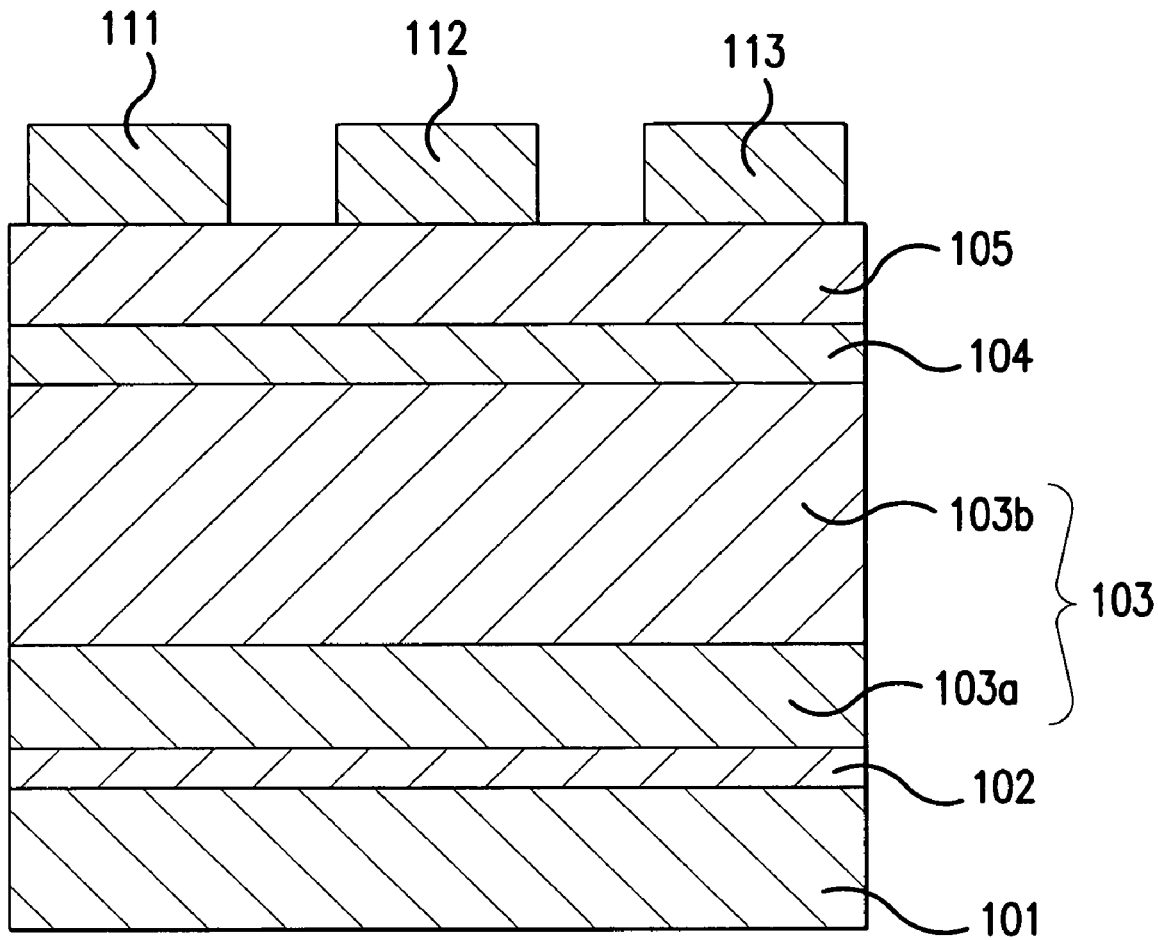
FIG. 1 is a schematic cross sectional view of a FET according to an embodiment of the invention.

The FET according to the invention will be described in detail below with reference to the accompanying drawings. FIG. 1 shows an example of one preferred embodiment of the invention. The example of the FET described below is only for specific explanation of the spirit of the invention, and any limitation of the scope of the invention by the examples is not intended. Especially, size, material, shape, and the relative configuration of the preferred embodiment described below are for illustration, and do not intend to limit the invention therein, unless specifically described. In the drawings, the size and the physical relationship of the components may be exaggerated for clarity. Multiple components may be constructed using the same member so that one member can serve multiple functions, or vice versa, a function of a component may be shared by multiple components.

In the invention, the nitride semiconductor is basically represented by the general formula $In_xAl_yGa_{1-x-y}N$ ($0 \leq x$, $0 \leq y$, $x+y \leq 1$). Also B, P, As or other suitable dopants can be contained therein.

A cross-sectional view of a HEMT of an example according to a preferred embodiment of the invention is shown in FIG. 1. The HEMT includes a buffer layer 102 and a first semiconductor layer 103a each including a p-type dopant, and a second semiconductor layer 103b, which is a carrier transit layer, that are stacked in order over a substrate 101. The concentration of the p-type dopant in the buffer layer 102 is higher than that in the first semiconductor layer 103a, and the concentration of the p-type dopant in the first semiconductor layer 103a is higher than that in the second semiconductor layer 103b. AlGaN layer 104 which is a spacer layer and a n-type AlGaN layer 105 which is a carrier supply layer are provided in order over the second semiconductor layer 103b, and a source electrode 111, a gate electrode 112, and a drain electrode 113 are respectively provided on the n-type AlGaN layer 105.

In the example of the invention, a HEMT is constructed by sequentially stacking each nitride semiconductor layer over a sapphire substrate using, for example, Metal Organic Chemical Vapor Deposition (MOCVD). As other methods for growing the semiconductor, Metal Organic Chemical Vapor Deposition (MOCVD), Hydride Vapor Phase Epitaxy (HVPE), and Molecular Beam Epitaxy (MBE) can also be used.

In the example of the invention, a sapphire substrate 101 is first placed in a MOCVD reaction vessel. Then, the temperature of the substrate is raised to about 1100° C. in a hydrogen atmosphere, and the surface of C-plane is cleaned with a flow of hydrogen.

After cleaning, the temperature of the substrate is reduced to about 530° C. and by using hydrogen as the carrier gas, trimethylgallium (TMG) and ammonia gas as the source gases, and cyclopentadienylmagnesium ($Cp_2Mg$) as the p-type dopant gas, a low temperature growth layer of the buffer layer 102 made of GaN is grown to a thickness of about 200 Å.

Then, supplying TMG and $Cp_2Mg$ is stopped and the temperature of the substrate is raised to about 1100° C., and a GaN layer 103 is grown to a thickness of about 3 μm using hydrogen as the carrier gas, with TMG and ammonia gas as the source gases.

Then, at a substrate temperature of about 1100° C., by using hydrogen as the carrier gas, with TMG, trimethylaluminum (TMA), and ammonia gas as the source gases, an AlGaN layer 104 (in the general formula $Al_xGa_{1-x}N$, the Al molar fraction X is about 0.2) is grown to a thickness of 50 Å as a spacer layer. By forming the AlGaN layer 104, the electron mobility can be further improved, but the spacer layer may also be omitted.

Then, at a substrate temperature of about 1100° C., by using hydrogen as the carrier gas, with TMG, TMA and ammonia gas as the source gases, and silane gas as a n-type dopant gas, a n-type AlGaN layer 105 made of AlGaN (Al molar fraction of 0.2) with Si concentration of $2 \times 10^{18}/cm^3$ is grown to a thickness of 150 Å. The n-type AlGaN layer 105 corresponds to a third semiconductor layer of the invention, which is a carrier supply layer. After the reaction was completed, the temperature is reduced to room temperature and the obtained wafer is removed from the reaction vessel.

Afterwards, sputtering is carried out to respectively deposit about 100 Å of Ti and about 300 Å of Al in this order on a predetermined region on the n-type AlGaN layer 105, so as to form a source electrode 111 and a drain electrode 113. Further, about 1000 Å of Ni and about 1500 Å of Au are disposed in this order by sputtering to form a gate electrode 112.

Further, as a protective layer, about 300 Å of SiN and about 10,000 Å of $SiO_2$ are disposed in this order over the surfaces of electrodes 111 to 113 and the n-type AlGaN layer 105 which is exposed from each electrode, thereby covering substantially the whole side of the semiconductor layer where the electrodes are disposed. At this time, by making the topmost surface of the protective film higher than the topmost surface of each electrode, the breakdown voltage between the gate electrode 112 and the drain electrode 113 can be improved.

When the HEMT thus obtained is analyzed by using Secondary Ion Mass Spectroscopy (SIMS), Mg is detected in almost all parts of the buffer layer 102 and the first semiconductor layer 103a, which is a lower region located close to the substrate, in the above-described GaN layer 103. Specifically, the SIMS analysis of the first semiconductor layer 103a shows that the Mg concentration is in a range between about $1 \times 10^{18}/cm^3$ and about $5 \times 10^{16}/cm^3$ at the interface or in the vicinity of the interface between the buffer layer 102 and the first semiconductor layer 103a (e.g., 5000 Å from the substrate surface in the direction of the film thickness). Also, the Mg concentration decreases from $1 \times 10^{18}/cm^3$ to $5 \times 10^{16}/cm^3$ as the thickness from the substrate surface increases to 5000 Å. In the GaN layer 103, the SIMS analysis shows the Mg concentration in the second semiconductor layer 103b, which is an upper region than the first semiconductor layer, is in a range between about $1 \times 10^{16}/cm^3$ and about $5 \times 10^{16}/cm^3$, which is a background level. The average value of the p-type dopant concentration in the first semiconductor layer 103a is about $3 \times 10^{17}/cm^3$.

According to the results of the analysis, the p-type dopant concentration in the second semiconductor layer 103b is homogeneous. This is believed to arise from the Mg not being actually included in the second semiconductor layer 103b in the concentration range shown above, and the range from about $1 \times 10^{16}/cm^3$ to about $5 \times 10^{16}/cm^3$ is probably the minimum limit of detection of the SIMS that is used to analyze this example. That is, in the second semiconductor layer 103b in this example, Mg may be included in concentrations less than the range between about $1 \times 10^{16}/cm^3$ and about $5 \times 10^{16}/cm^3$, or may not be included. Also, the buffer layer is located in the vicinity of the interface with a foreign substrate, so that the Mg concentration in the buffer layer can not be ascertained by the SIMS analysis shown above.

In the present example, $Cp_2Mg$ is not supplied when the GaN layer 103 is grown. However, a significant amount of Mg that is included in the buffer layer 102 diffuses into the GaN layer 103, so that the first semiconductor layer 103a having the p-type dopant is formed in the GaN layer 103. That is, the GaN layer 103 comprises two layers of the first semiconductor layer 103a and the second semiconductor layer 103b. The first semiconductor layer 103a contains the p-type dopant in a manner that the p-type dopant concentration decreases from about $1 \times 10^{18}/cm^3$ to about $5 \times 10^{16}/cm^3$. The second semiconductor layer 103b may include the p-type dopant concentration less than the range between about $1\times10^{16}/cm^3$ and about $5\times10^{16}/cm^3$ which is lower than the p-type dopant concentration in the first semiconductor layer, or may not include the p-type dopant and functions as the carrier transit layer.

Figure 2:
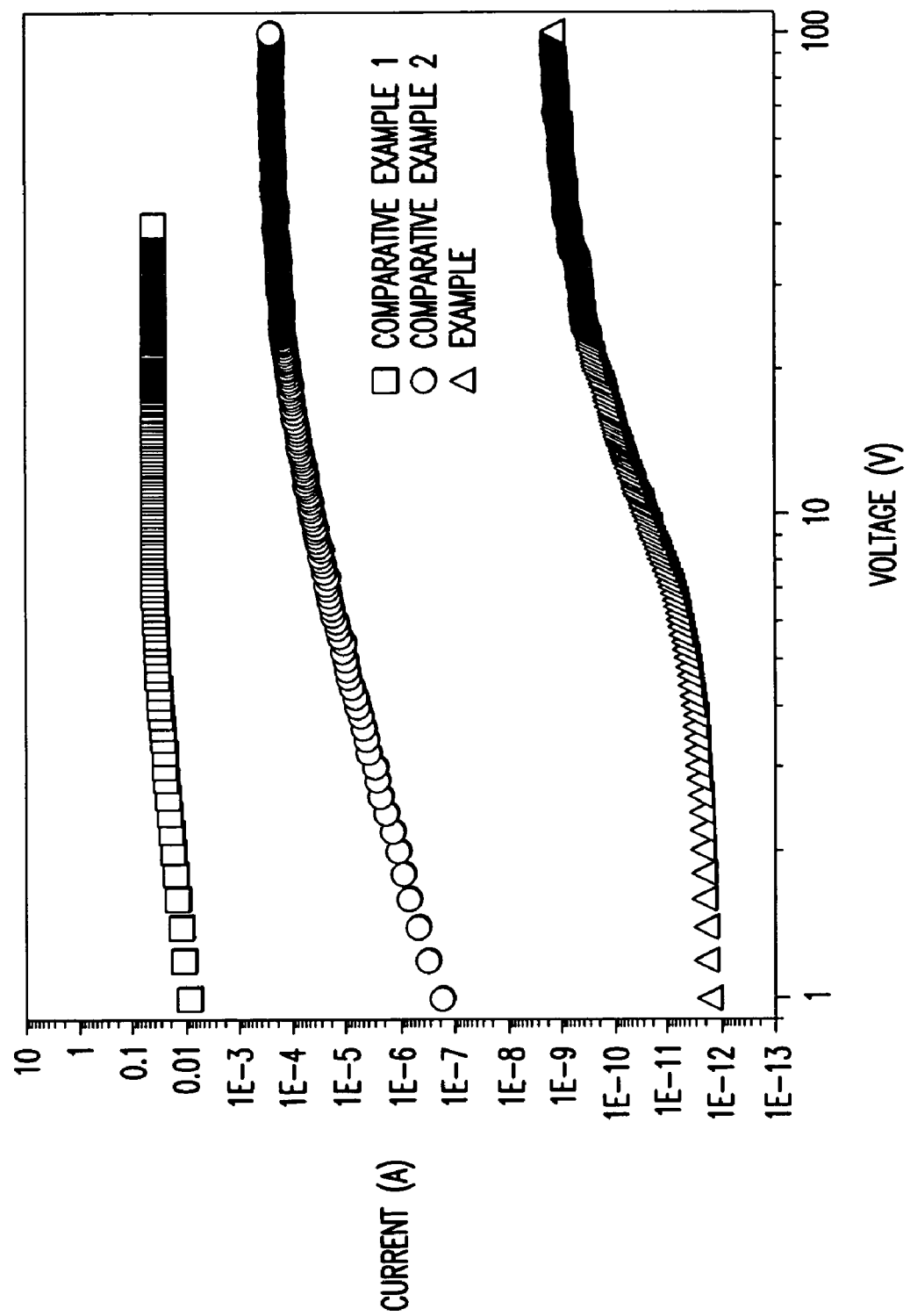
FIG. 2 is a graph showing the leak current as a function of the applied voltage according to an embodiment of the invention.
Figure 3:
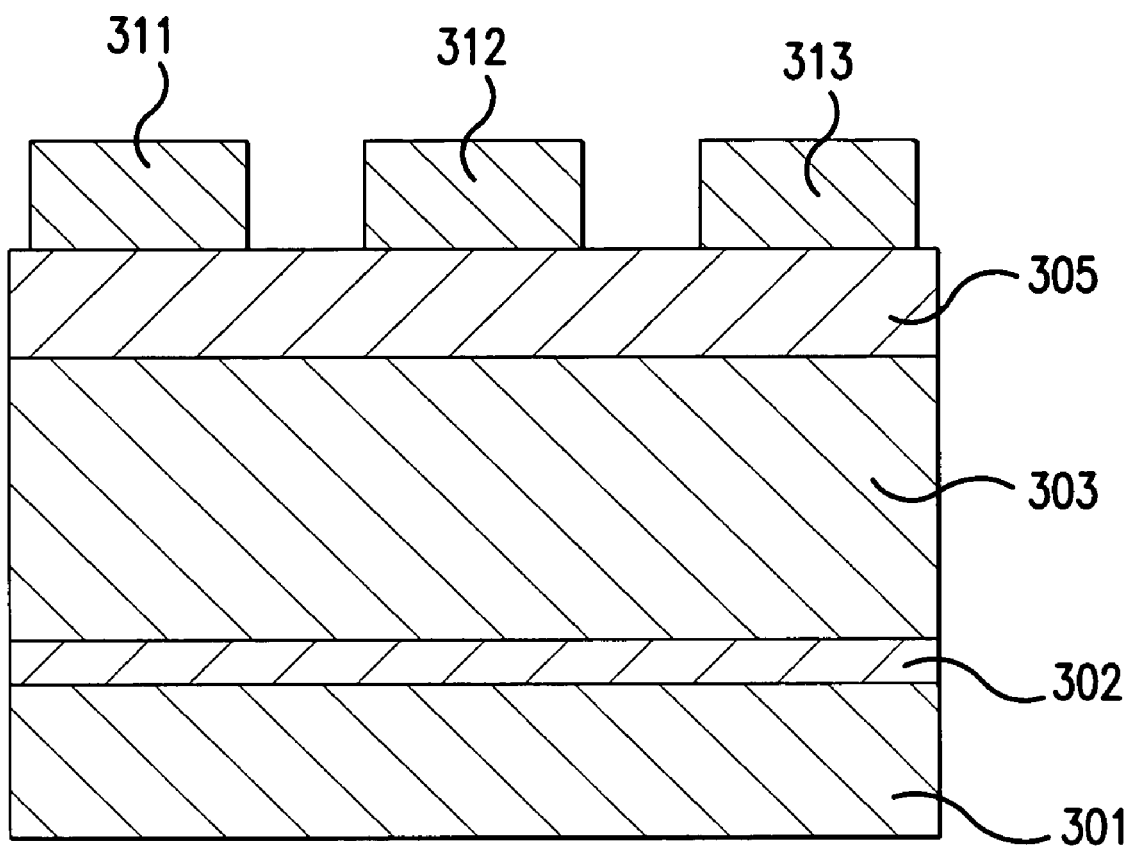
FIG. 3 is a schematic cross sectional view showing a layered-structure of a related art FET.

Further considerations pertaining to the underlayer of the HEMT of the present Example of the invention and Comparative Examples 1 and 2 are provided below. FIG. 2 shows the leak current relative to the applied voltage that is examined on the HEMTs of the example of the invention (present example) and the comparative examples. In the present example, the leak current is substantially reduced and the breakdown voltage is spectacularly improved, compared to the HEMTs according to Comparative Examples 1 and 2. In the HEMTs of Comparative Example 1, the buffer layer 102 is grown without a supply of Mg. In the HEMT of Comparative Example 2, after the buffer layer 102 is grown without a supply of Mg, the GaN layer is grown with a supply of Mg. For example, at an applied voltage of 10 V, according to the present example, the leak current can be reduced by about a factor of $10^{-9}$ compared to Comparative Example 1 and by about a factor of $10^{-8}$ compared to Comparative Example 2. In data obtained from another measurement, a sheet resistance ($\Omega$/sq.), a mobility ($cm^2$/Vs), and a sheet carrier concentration ($cm^{-2}$) of Comparative Examples 1 and 2 are about the same as that of the present example, and that of the Comparative Examples are about 450 $\Omega$/sq., about 1400 $cm^2$/Vs about $9.5\times10^{12}/cm^{-2}$, respectively. Moreover, with respect to breakdown voltage, the HEMTs of the present example can perform normally as a transistor up to about 500 V, contrary to the HEMTs of Comparative Example 1 which is destroyed beyond the breakdown voltage by excess current and to the HEMTs of Comparative Example 2 which is destroyed at about 250 V. In the indication in the vertical axis in FIG. 2, for example, "1E−10" represents $1\times10^{-10}$. In further consideration, when the dopant in the buffer layer of the above-described example is Fe in place of Mg, a mobility of its under layer measured in the same manner described above decreases in about one third of the above-described example, and, in HEMT, On-state breakdown voltage tends to become lower than that of the Comparative Example 1 and 2, resulting in a lower voltage than 100V. Meanwhile, a leak current or a leak path tends to be improved more than that of Comparative Examples 1 and 2. Moreover, when the dopant in the buffer layer of the above-described example is Zn in place of Mg, each characteristic of its under layer measured in the same manner described above tends to be nearly on an equality with the above-described example.

The decrease in leak current and improvement in breakdown voltage, achieved by the structure according to the example of the invention are considered as below.

By arranging the p-type dopant concentration in the buffer layer 102 to be higher than that in the first semiconductor layer 103a, and the p-type dopant concentration in the first semiconductor layer 103a to be higher than that in the second semiconductor layer 103b, the concentration of the carrier (electrons) in the region located closer to the sapphire substrate 101 can be reduced more sufficiently than in the channel created in the second semiconductor layer 103b. As a result, the leak current is reduced and the breakdown voltage is increased. It may be considered that the reduction in the carrier concentration is achieved by forming the first semiconductor layer 103a having the p-type dopant in a lower concentration on the substrate via the buffer layer 102 having a higher dopant concentration, and the p-type dopant included in the first semiconductor layer 103a exerts somewhat preferable effects on the second semiconductor layer 103b. In other words, the p-type dopant in the first semiconductor layer 103a may preferably affect the second semiconductor layer 103b, which has a lower p-type dopant concentration than in the first semiconductor layer 103a, because of the existence of the buffer layer 102, which has a higher p-type dopant concentration than in the first semiconductor layer 103a.

Further, the crystallinity of the semiconductor layers (other than the buffer layer 102) such as the first semiconductor layer 103a is higher than that of the buffer layer 102. Therefore, they are influenced by a dopant more easily. Thus, when a large amount of a p-type dopant is contained in the first semiconductor layer 103a, the crystallinity deteriorates and as a result, the device characteristic is impaired. In contrast, when a large amount of dopant is contained in the buffer layer 102 disposed over the foreign substrate such as the sapphire substrate 101 (whose lattice constant differs largely from that of the buffer layer 102), the crystallinity of the buffer layer is less influenced, because the crystallinity of the buffer layer 102 is intrinsically lower. Therefore, it is considered that when even a large amount of the p-type dopant is contained in the buffer layer 102, the crystallinity of the layers formed above the buffer layer 102 is hardly affected. It is considered that crystallinity property of each layer, especially the first and second semiconductor layer, is also utilized in the invention, and thus the FET is excellent in mass productivity and reproducibility.

In view of the diffusion of the p-type dopant in the buffer layer 102, it is possible that the p-type dopant is not contained in the layers formed over the buffer layer 102, but the p-type dopant is contained only in the buffer layer 102. For example, the p-type dopant can be contained only in part of the buffer layer 102 close to the sapphire substrate 101, so as to prevent the p-type dopant from reaching the semiconductor layers through the buffer layer 102 even when the p-type dopant diffuses. However, the buffer layer 102 functions as the underlayer. Thus, even if the p-type dopant is contained only in the buffer layer 102, the carrier concentration of the layers, which are formed over the buffer layer, cannot be sufficiently reduced. Therefore, as in the invention, it is important that the p-type dopant is contained in both the buffer layer 102 and the first semiconductor layer 103a.

In an embodiment of the invention Different from the exemplified embodiment, the p-type dopant may be contained in the first semiconductor layer 103a by using a p-type dopant gas when growing the first semiconductor layer 103a. However, the p-type dopant may not be included into the first semiconductor layer 103a at a lower concentration and with good reproducibility, without sacrificing the crystallinity of the layer. This arises from the second semiconductor layer functioning as a region that prevents the diffusion of a dopant, as an intervening layer locating between the first semiconductor layer and as an active region including the third semiconductor layer or the carrier transit layer (channel). The second semiconductor layer also functions as an underlayer of the third semiconductor layer or the active region. Further, the upper region of the second semiconductor layer, which is closer to the third semiconductor, is an active region that functions as the carrier transit layer (channel). Therefore, as shown in the present example, it is more preferable to form the first semiconductor layer 103a having the p-type dopant by diffusing the p-type dopant from the buffer layer 102 to the first semiconductor layer, and to separate the first semiconductor layer and the active region or the third semiconductor layer by the second semiconductor layer. That is, it is preferable that after forming the buffer layer 102 on the sapphire substrate 101 with a supply of the p-type dopant, the supply of the p-type dopant is stopped and the semiconductor layer is formed. Thus, as a result, the p-type dopant is included into the semiconductor layer by diffusion when the first semiconductor layer 103a is formed. With this construction, a FET having excellent mass productivity and reproducibility can be obtained.

An analysis of the example of the invention shows that the p-type dopant concentration in the first semiconductor layer 103a declines in the thickness direction from the buffer layer 102 toward the second semiconductor layer 103b. The dopant concentration can be adjusted by, for example, supplying $Cp^2Mg$ while growing the first semiconductor layer as described above so as to impart the p-type dopant to the first semiconductor layer 103a uniformly or with an increased amount or the like. From the viewpoint of maximizing the advantages of the invention and good reproducibility, it is preferred to arrange the p-type dopant concentration in the first semiconductor layer 103a so as to decline in the thickness direction from the buffer layer 102 toward the second semiconductor layer 103b.

Here, the levels of the p-type dopant concentration in the first semiconductor layer 103a and the second semiconductor layer 103b are determined by comparing the average values of the p-type dopant concentration in the respective layers, regardless of whether the p-type dopant uniformly is contained in a layer. That is, in the present application, the p-type dopant concentration is described as an average value unless specifically described as the maximum value or the minimum value or the like.

(Underlayer)

The basic structure of the FET of the invention includes an underlayer and an active region that is disposed over the underlayer and functions as a device. In the above example, the underlayer at least includes the buffer layer and the first semiconductor layer, and in addition preferably includes a partial region of the second semiconductor layer facing the substrate. The underlayer is provided over the substrate in order to form the active region that is the device region, and mostly to improve the crystallinity.

Conventionally, such as the case shown below in Comparative Example 1, a buffer layer and GaN layer are provided as the underlayer. However, with this construction, a leak in the underlayer, especially a leak path in the buffer layer, may generate and the resulting function of the device such as a FET may be impaired. In the FET of the invention, however, the leak problem of the underlayer can be solved. With respect to the layer thickness of the semiconductor layer and the carrier concentration in a conventional stacked-layer structure, there is a tendency for the carrier concentration per volume unit in the semiconductor layer to increase as the layer thickness is reduced by RIE etching. However, the carrier mobility and the carrier concentration per area unit tend to become substantially constant.

Specifically, in order to evaluate a relationship between the layer thickness of the semiconductor layer and the carrier concentration, a stacked structure which is laminated with an undoped GaN of a 200 Å thick buffer layer and a 3 μm thick GaN layer thereon is provided for samples having a thickness of about 3 μm, about 2 μm or about 0.5 μm, respectively, and entire semiconductor layers of each sample with electrodes placed on both side faces thereof is analyzed. The carrier concentration per unit volume is about at the $10^{16}/cm^{-3}$ level, and the concentration at about 2 μm is slightly higher than that at about 3 μm, the concentration at about 0.5 μm is much higher than that at about 2 μm, and the mobility and the carrier concentration per unit area is in a range of about 100-120 $cm^2/Vs$ and about $4-6\times10^{12}/cm^2$ respectively. Accordingly, it is believed that a significant amount of residual carrier is distributed in the region of about 0.5 μm thickness from the substrate. On the other hand, when a sample of about 0.5 μm is made in the same manner as the examined example described above, an analysis of the entire layer cannot be carried out due to its high resistance.

As described above, it is believed that the carrier concentration found in an underlayer in a conventional structure is based on a residual carrier component. In the structure of the invention, it is believed that especially the underlayer contributes to compensate the residual component. On the other hand, the leak problem in a conventional underlayer, especially in the buffer layer locating in the bottom part of the underlayer, seems to be difficult to resolve even by increasing the thickness thereof. It is considered that the problems of two paths, 1) a path in a vertical direction from the active region, in particular, each electrode, to a lower part of the underlayer, that is a part near the substrate surface, and 2) a path in a lateral direction that is the carrier transit direction in the active region or in-plane direction of the substrate, should be solved. It is believed that the carrier compensation described above acts to close the path in vertical direction.

Therefore, the path in vertical direction is closed by providing a gradient dopant concentration that increases in the direction of the thickness to the substrate, and the crystallinity of the active region can also be optimized to be superior. It is considered that by providing such a concentration gradient in the first semiconductor layer locating near the buffer layer (where the lateral path is thought to exist), the effect of closing the path can be improved and recovery of crystallinity exerted by the second semiconductor layer (which is located between the active region and the underlayer and separate thereby these layers) can also be improved. The thickness of the first semiconductor layer depends on the residual carrier and leak path that in turn depend on the growth method and conditions and the like. It is preferable to make the thickness of the first semiconductor layer in a range between about 0.5 to 1 μm in the example described above.

(Buffer Layer)

The buffer layer is provided between the substrate and the semiconductor layer to improve the lattice match between the substrate and the semiconductor layer, which allows the crystal growth of the semiconductor layer. Specifically, formation and growth of the crystalline nucleus of the semiconductor crystal occur in the buffer layer. Not only using a buffer layer grown at a low-temperature shown in the example above and/or a two-step method, but also other methods can also be used. Examples of such methods include methods in which a material different from the semiconductor layer is interposed. This is considered because when a dislocation or lattice mismatch between the semiconductor layer and the buffer layer exists, a leak path described above may be generated.

The p-type dopant concentration in the buffer layer 102 is for example, from about $1\times10^{18}/cm^3$ to about $5\times10^{21}/cm^3$, preferably from about $1\times10^{19}/cm^3$ to about $1\times10^{21}/cm^3$, and more preferably from about $1\times10^{19}/cm^3$ to about $5\times10^{20}/cm^3$. With this range of the concentration, the buffer layer 102 and the first semiconductor layer 103a function together and the advantageous effects of the invention can be attained reproducibly and more efficiently. When the p-type dopant is introduced into the first semiconductor layer by diffusion, the p-type dopant can be contained in the first semiconductor layer with a suitable concentration, concentration distribution, and good reproducibly for producing the effects of the invention.

(First Semiconductor Layer)

The p-type dopant concentration in the first semiconductor layer 103a is for example, from about $5 \times 10^{16}$/cm$^3$ to about $1 \times 10^{19}$/cm$^3$, preferably from about $5 \times 10^{16}$/cm$^3$ to about $5 \times 10^{18}$/cm$^3$, and more preferably from about $1 \times 10^{17}$/cm$^3$ to about $1 \times 10^{18}$/cm$^3$. With this range of concentration, the buffer layer 102 and the first semiconductor layer 103a function together and the advantageous effects of the invention can be achieved reproducibly and more efficiently.

A sample with a residual film thickness of about 800 nm according to the invention is made in the same manner as the examination cases described above, and the dopant concentration distribution therein is examined by using SIMS analysis. A substantially constant dopant concentration distribution of about $1.8 \times 10^{18}$/cm$^3$ is observed in the layer in a thickness from the surface to about 400 nm, and a concentration gradient that gradually decreases toward the surface where the concentration is at a back-ground level of about $1 \times 10^{17}$/cm$^3$ is observed. Accordingly, in the first semiconductor layer, which is a region to about 0.5 μm from the bottom (i.e. a main distribution region of the residual carrier described above), the p-type dopant concentration has a substantially constant distribution. On the other hand, the p-type dopant concentration in the first semiconductor layer declines toward the second semiconductor layer.

The buffer layer, the first semiconductor layer, and the second semiconductor layer can have different compositions, and in a same manner, the spacer layer and carrier supply layer may have different compositions.

In the present example, Mg is used as the p-type dopant. However, a dopant other than Mg, such as Zn, Cd, or the like, can also be used. In order to obtain the advantage of the invention with good reproducibility and effectiveness, it is preferable to use Mg or Zn, and more preferable to use Mg.

As described above, in the stacked-layer structure of the invention, a different layer may also be disposed between the buffer layer and the first semiconductor layer and/or between the first semiconductor layer and the second semiconductor layer. However, in order to obtain the advantage of the invention more reproducibly and more easily, the buffer layer is preferably in contact with the first semiconductor layer, and the first semiconductor layer is preferably in contact with the second semiconductor layer. A p-type dopant can be contained partially in the buffer layer and/or the first semiconductor layer. However, in order to obtain the effects of the invention more reproducibly and more easily, the p-type dopant is preferably contained in the entire area of the buffer layer and the first semiconductor layer.

[Active Region]

The FET according to the invention has a structure where the device is driven by the active region provided over the underlayer, and specifically, has a device structure having a carrier transit region or channel, which is hereinafter described specifically, a carrier supply layer, and further, an electrode is disposed into the active region.

In the above-described example, the device is a lateral conduction type in which the carrier transit in a direction approximately parallel to the substrate surface. However, a structure in which the carrier travels in vertical direction can also be employed. Further, a unipolar device, in which the electrons are the carrier, is employed herein, but the holes can also be used as the carrier. Further, in the second semiconductor layer, a region near the first semiconductor is used as the underlayer, and an upper region near the third semiconductor layer is used as the channel, which is the active region. However, the second semiconductor layer can also be used only as the underlayer without forming the active region, or can be made as a reverse conductive type layer having the different conductive type from the active region. However, in a nitride semiconductor, it is difficult to modify the substrate to the p-type, so that it is preferred that the substrate is used as the underlayer.

As described above, the underlayer or the region in the second semiconductor layer functioning as the underlayer is preferably formed as a semi-insulating or i-type layer.

(Second Semiconductor Layer)

By forming the second semiconductor layer between the underlayer and the active region so as to separate the layers, negative effects of the underlayer on the active region due to the dopant contained in the underlayer can be reduced. Recovery of the crystallinity that deteriorates from the dopant contained in the underlayer can be expected by providing a region having a low dopant concentration, specifically a lower concentration than in the first semiconductor layer in the second semiconductor layer. When the region has a preferable thickness of about 1 μm or greater, or more preferably thickness of about 1.5 μm or greater, sufficient crystallinity can be obtained. On the other hand, when a channel where the carrier transit layer is formed, it is preferable to form the layer on the region where the dopant concentration has been adjusted. Specifically, a region of several nm in depth can be provided near the surface for the second semiconductor layer.

The p-type dopant concentration in the second semiconductor layer 103b may be less than about $5 \times 10^{17}$/cm$^3$, preferably less than about $1 \times 10^{17}$/cm$^3$, and more preferably less than about $5 \times 10^{16}$/cm$^3$. With this concentration, the carrier (electron) mobility in the second semiconductor layer 103b can be further improved. In the invention, the range described above includes cases where the p-type dopant is actually included in the described range and where the p-type dopant is not included in the described range. In view of the crystallinity described above, it is preferable to form the second semiconductor layer without adding a dopant. In other words, it is preferable to form the second semiconductor layer undoped.

When the p-type dopant is not included homogeneously, i.e., when the p-type dopant is not included at a constant concentration in the buffer layer 102 and/or the first semiconductor layer 103a, the minimum concentration of the p-type dopant in the buffer layer 102 is preferably higher than the maximum concentration of the p-type dopant in the first semiconductor layer 103a. With this arrangement, the effect of the invention can be obtained more easily and reproducibly.

(Substrate)

In the present example, a C-plane sapphire substrate is used. However, a foreign substrate is preferably used for stacking each semiconductor layer. Other kinds of substrates such as a insulating substrate such as a R-plane sapphire, a A-plane sapphire ($Al_2O_3$), and a spinal ($MgAl_2O_4$), a conductive substrate such as SiC (including 6H, 4H, or 3H), ZnS, ZnO, GaAs, and Si, or a semiconductor substrate can be used as the substrate. Thus, a substrate other than a nitride semiconductor, which preferably requires a buffer layer, can be used. A buffer layer can be formed by using a nitride semiconductor substrate such as GaN and AlN, made of the same kind of material as the semiconductor layer. In a substrate made of the same kind of material, the problem of a leak path caused by the buffer layer may be suppressed. However, in order to obtain the advantages of the invention more effectively in a more reproducible fashion, a sapphire substrate is preferable.

(Device Structure: Spacer Layer, Carrier Transit Layer, Carrier Supply Layer)

Hereinafter, the third semiconductor layer formed over the second semiconductor layer, and the spacer layer and the carrier layer constructing the device structure layer, and an active region such as the carrier transit layer will be described.

In the above-described example, GaN is used as the buffer layer, the first semiconductor layer, and the second semiconductor layer, and AlGaN is used as the spacer layer and the carrier supply layer. However, a nitride semiconductor layer having a composition different from that shown in the example can also be used for each layer, for example, AlN, AlGaN and the like may be used for the buffer layer.

In the above-described example, Si, which can be an n-type dopant, is contained in the carrier (electron) supply layer in order to increase the carrier (electron) concentration. However, the leak current in the carrier supply layer may further be reduced by lowering the concentration of Si or omitting the inclusion of Si. The carrier transit layer can be doped with a suitable n-type dopant such as Si in order to reduce the amount of electrons traveling in the carrier transit layer other than the channel. Among the electrodes disposed on the upper surface of the carrier transit layer, the source electrode and the drain electrode are ohmic electrodes and the gate electrode is a Schottky electrode. A contact layer can be disposed between each electrode and the carrier supply layer so as to provide the ohmic contact property or Shottky contact property to the corresponding layers.

A HEMT has been described above. However, for example, by forming an n-type GaN layer on the second semiconductor layer made of GaN and providing each electrode thereon, a MESFET can also be constructed in accordance with the invention. The second semiconductor layer $103b$ can be formed with a low carrier (electron) concentration according to the invention. Therefore, it is especially effective when the upper region in the second semiconductor layer $103b$ is used as the carrier transit layer in the HEMT.

COMPARATIVE EXAMPLE 1

A HEMT is constructed in substantially the same manner as in the above-described example, except that $Cp_2Mg$ is not supplied when the buffer layer 102 is grown. That is, in the construction, the HEMT of Comparative Example 1 differs from the example in having the buffer layer 102 and the first semiconductor layer $103a$ without inclusion of Mg.

In Comparative Example 1, no improvements are provided to the region of the carrier transit layer facing the substrate, and therefore the performance thereof is inferior to the above-described example, as shown in FIG. 2.

COMPARATIVE EXAMPLE 2

A HEMT is constructed in substantially the same manner as in the example of the invention except that the buffer layer is grown without a supply of $Cp_2Mg$, then with a supply of $CP_2Mg$, a GaN layer followed by the GaN layer 103 are grown. In detail, the GaN layer containing Mg and locating between the buffer layer and the GaN layer 103 is formed with a thickness of 200 Å and an Mg concentration of $5\times10^{19}/cm^3$.

In Comparative Example 2, the GaN layer containing Mg is provided on the buffer layer so that Mg diffuses into both the GaN layer locating on the GaN layer containing Mg and the buffer layer locating under the GaN layer containing Mg. Even with this arrangement, the performance is inferior to the example of the invention, as shown in FIG. 2. The reasons therefore are discussed below. First, when a high concentration of Mg is not included in the buffer layer, Mg preferably does not affect the carrier transit layer. Second, the problem of leak path in the buffer layer and in the region over the buffer layer is not fully suppressed. Third, a significant amount of Mg is contained in a layer, which originally has relatively good crystallinity and is located over the Mg-doped GaN layer such as the GaN layer 103, and thus leads to deterioration of the crystallinity.

As described above, by contrasting Comparative Example 2 with the above-described example of the invention, it is understood that the p-type dopant concentration distribution and the location thereof significantly contribute to the performance of the FET, especially to alleviating the leak problem.

The invention can be applied to field-effect transistors (FETs), specifically to high output power semiconductor devices capable of operating at higher frequencies with higher breakdown voltage, such as metal semiconductor FETs (MESFETs), and high electron mobility transistors (HEMTs). The invention is also applicable not only to the lateral devices and the surface conduction type devices, but also to the vertical type devices.

It is to be understood that the foregoing descriptions and specific embodiments shown herein are merely illustrative of the best mode of the invention and the principles thereof, and that modifications and additions may be easily made by those skilled in the art without departing for the spirit and scope of the invention, which is therefore understood to be limited only by the scope of the appended claims.

We claim:

1. A field-effect transistor comprising:
   a substrate;
   a buffer layer comprising a nitride semiconductor over the substrate;
   a first semiconductor layer comprising a nitride semiconductor over the buffer layer; and
   a second semiconductor layer comprising a nitride semiconductor over the first semiconductor layer,
   wherein at least said buffer layer and said first semiconductor layer contains a p-type dopant,
   a concentration of the p-type dopant in said buffer layer is higher than a concentration of the p-type dopant in said first semiconductor layer, and
   a concentration of the p-type dopant in said first semiconductor layer is higher than a concentration of the p-type dopant in said second semiconductor layer.

2. The field-effect transistor according to claim 1,
   wherein the concentration of the p-type dopant in said first semiconductor layer decreases along a direction of a thickness from an interface with said buffer layer or in the vicinity of said interface with said buffer layer to said second semiconductor layer.

3. The field-effect transistor according to claim 1,
   wherein the concentration of the p-type dopant in said buffer layer is in a range between about $1\times10^{18}/cm^3$ and about $5\times10^{21}/cm^3$.

4. The field-effect transistor according to claim 1,
   wherein the concentration of the p-type dopant in said first semiconductor layer is in a range between about $5\times10^{16}/cm^3$ and about $1\times10^{19}/cm^3$.

5. The field-effect transistor according to claim 1,
   wherein the concentration of the p-type dopant in said second semiconductor layer is less than about $5\times10^{17}/cm^3$.

6. The field-effect transistor according to claim 1, further comprising
   a third semiconductor layer comprising a nitride semiconductor over the second semiconductor layer, wherein said second semiconductor layer is a carrier transit layer, and said third semiconductor layer is a carrier supply layer.

7. The field-effect transistor according to claim 1, wherein the p-type dopant is magnesium (Mg).

8. A method for producing a field-effect transistor comprising steps of:
   providing a substrate;
   forming a buffer layer comprising a nitride semiconductor over the substrate;
   forming a first semiconductor layer comprising a nitride semiconductor over the buffer layer; and
   forming a second semiconductor layer comprising a nitride semiconductor over first semiconductor layer,
   wherein at least said buffer layer and said first semiconductor layer contains a p-type dopant,
   a concentration of the p-type dopant in said buffer layer is higher than a concentration of the p-type dopant in said first semiconductor layer, and
   a concentration of the p-type dopant in said first semiconductor layer is higher than a concentration of the p-type dopant in said second semiconductor layer.

9. The method for producing a field-effect transistor according to claim 8, wherein the concentration of the p-type dopant in said first semiconductor layer decreases along a direction of a thickness from an interface with said buffer layer or in the vicinity of said interface with said buffer layer to said second semiconductor layer.

10. The method for producing a field-effect transistor according to claim 8, wherein the concentration of the p-type dopant in said buffer layer is in a range between about $1\times10^{18}/cm^3$ and about $5\times10^{21}/cm^3$.

11. The method for producing a field-effect transistor according to claim 8, wherein the concentration of the p-type dopant in said first semiconductor layer is in a range between about $5\times10^{16}/cm^3$ and about $1\times10^{19}/cm^3$.

12. The method for producing a field-effect transistor according to claim 8, wherein the concentration of the p-type dopant in said second semiconductor layer is less than about $5\times10^{17}/cm^3$.

13. The method for producing a field-effect transistor according to claim 8, further comprising a step of:
   forming a third semiconductor layer comprising a nitride semiconductor over the second semiconductor layer,
   wherein said second semiconductor layer is a carrier transit layer, and said third semiconductor layer is a carrier supply layer.

14. The method for producing a field-effect transistor according to claim 8, wherein the p-type dopant is magnesium (Mg).

* * * * *